(12) United States Patent
Higashi et al.

(10) Patent No.: US 7,554,126 B2
(45) Date of Patent: Jun. 30, 2009

(54) SEMICONDUCTOR LIGHT-EMITTING ELEMENT, MANUFACTURING METHOD AND MOUNTING METHOD OF THE SAME AND LIGHT-EMITTING DEVICE

(75) Inventors: Kazushi Higashi, Osaka (JP); Shinji Ishitani, Hyogo (JP)

(73) Assignee: Panasonic Corporation, Osaka (JP)

( * ) Notice: Subject to any disclaimer, the term of this patent is extended or adjusted under 35 U.S.C. 154(b) by 291 days.

(21) Appl. No.: 11/662,547

(22) PCT Filed: Sep. 22, 2005

(86) PCT No.: PCT/JP2005/017467

§ 371 (c)(1),
(2), (4) Date: Mar. 12, 2007

(87) PCT Pub. No.: WO2006/035664

PCT Pub. Date: Apr. 6, 2006

(65) Prior Publication Data

US 2007/0262338 A1    Nov. 15, 2007

(30) Foreign Application Priority Data

Sep. 27, 2004    (JP) ............................ 2004-279049

(51) Int. Cl.
*H01L 33/00* (2006.01)
(52) U.S. Cl. .......................... 257/79; 438/22
(58) Field of Classification Search ................... 257/79, 257/81; 438/22
See application file for complete search history.

(56) References Cited

U.S. PATENT DOCUMENTS 7,095,061 B2    8/2006   Steigerwald et al.

FOREIGN PATENT DOCUMENTS

| CN | 1529364 | 9/2004 |
|---|---|---|
| JP | 6-177434 | 6/1994 |
| JP | 11-161197 | 6/1999 |
| JP | 11-204830 | 7/1999 |
| JP | 11-340514 | 12/1999 |
| JP | 11-354836 | 12/1999 |
| JP | 2000-114595 | 4/2000 |
| JP | 2002-43623 | 2/2002 |
| JP | 2002-57374 | 2/2002 |
| JP | 2002-151739 | 5/2002 |
| JP | 2003-303992 | 10/2003 |
| JP | 2004-80050 | 3/2004 |
| JP | 2004-103975 | 4/2004 |
| JP | 2005-136177 | 5/2005 |

*Primary Examiner*—Roy K Potter
(74) *Attorney, Agent, or Firm*—Wenderoth, Lind & Ponack, L.L.P.

(57) ABSTRACT

An LED chip of the present invention has a structure in which an n-type semiconductor layer and a p-type semiconductor layer are successively formed on the lower face of an element substrate, with the p-type semiconductor layer being formed on an area except for an area for an n-electrode. A first n-electrode is formed on the area for the n-electrode and a first p-electrode is formed on the p-type semiconductor layer. A first insulating layer having openings and is formed on the first n-electrode and the first p-electrode, and a second n-electrode and a second p-electrode having virtually the same size are formed on the first insulating layer. With this arrangement, the electrode on the n-type semiconductor layer can be made larger, thereby a mounting process of LED chips onto a circuit board can be executed by using solder at low costs.

13 Claims, 17 Drawing Sheets

SEMICONDUCTOR LIGHT-EMITTING ELEMENT, MANUFACTURING METHOD AND MOUNTING METHOD OF THE SAME AND LIGHT-EMITTING DEVICE

TECHNICAL FIELD

The present invention relates to a semiconductor light-emitting element, a manufacturing method and a mounting method of the same and a light-emitting device formed by mounting such semiconductor light-emitting elements on a circuit board.

BACKGROUND ART

In recent years, a technique in which a number of bare chips of semiconductor light-emitting elements are mounted on a circuit board, typically represented by a light emitting diode (hereinafter, referred to as "LED"), to manufacture illuminating and display devices or the like has been widely utilized. With respect to the mounting technique for mounting the bare chips for the LED (hereinafter, referred to as "LED chip") on a circuit board, a flip chip junction utilizing bumps, for example, described in Patent Document 1 and Patent Document 2, has been generally used.

FIG. 16 is a cross-sectional view that schematically shows a state in which LED chips having a typically conventional structure are mounted on a circuit board. FIG. 17 is a bottom view of the conventional LED chip. FIG. 16 is the drawing that schematically shows a cross section taken along line C-C of FIG. 17.

An LED chip 101 has a light-transmitting substrate 111 (hereinafter, referred to as "element substrate"), an n-type semiconductor layer 112 formed on the element substrate 111 so as to cover the element substrate 111, a p-type semiconductor layer 113 formed so as to cover an area on the n-type semiconductor layer 111a from which an area 112a for an n-electrode (see FIG. 17) on the corners of the n-type semiconductor layer 112 is excluded, an n-electrode 114 formed on the area 112a for the n-electrode on the n-type semiconductor layer 112, and a p-electrode 115 formed on the p-type semiconductor layer 113.

The LED chip 101 is electrically connected to a circuit board 140 by respectively joining the n-electrode 114 and the p-electrode 115 to a plurality of bumps 142 formed on the electrode 141 on the circuit board 140 by utilizing ultrasonic waves. The LED chip 101, thus electrically connected to the circuit board 140, is allowed to emit light when an electric current flows through a pn junction 123 between the n-type semiconductor layer 112 and the p-type semiconductor layer 113.

Patent Document 1: Japanese Unexamined Patent Publication No. 11-161197
Patent Document 2: Japanese Unexamined Patent Publication No. 11-354836

DISCLOSURE OF THE INVENTION

Issue to be Improved by the Invention

Conventionally, an LED chip having a size of 0.3 mm in each side of square has been commonly used, and in recent years, the applications thereof have been expanded because of its advantages, such as low power consumption and mercury-less structure, so that large-size LED chips (for example, having a size of 1 mm or more in each side of square), which can achieve a high power output with high efficiency and are suitably applied to a middle/large-size liquid crystal backlight, a special illuminating device and a car headlight, have been widely developed. In the above-mentioned conventional mounting technique using the flip chip junction, however, when the size of the LED chip exceeds 0.5 mm in each side of square, it becomes necessary to form a number of bumps on the p-electrode in order to allow the LED chip to uniformly emit light. To form a number of bumps on the p-electrode is not desirable because of a higher possibility of a reduction in the yield of junctions and of short-circuiting and connection failure, due to positional deviations at the time of mounting.

On the other hand, in the field of mounting electronic components, with respect to large-size electronic components, in general, a mounting process onto a circuit board is carried out at low costs by using a conductive bonding material such as solder and silver paste. However, in the case of the conventional LED chip 101, since the light emission is executed through the pn junction 123 as described above, the junction face between the n-type semiconductor layer 112 and the n-electrode 114 needs to be made as small as possible and the junction face between the n-type semiconductor layer 112 and the p-type semiconductor layer 113, which corresponds to the light-emitting area, needs to be made larger, in order to enlarge the light-emitting area. For this reason, even if the LED chip 101 is made larger, the area on the n-electrode 114 is not necessarily made larger.

Therefore, upon mounting the conventional LED chip 101, since the area on the n-electrode 114 is small, it is difficult to use a conductive bonding material required for a large joining area such as solder and anisotropic conductive resin (for example, a width of 0.1 mm or more with a joining area of 0.04 mm$^2$ or more in the case of solder, and a width of 0.20 mm or more with a joining area of 0.08 mm$^2$ or more in the case of anisotropic conductive resin), and it is inevitably necessary to carry out a mounting process through a flip chip junction by utilizing bumps as described above. Moreover, since, after positioning the bumps on such small n-electrodes, the mounting process has to be executed, high mounting precision is required. For this reason, the production efficiency is lowered to cause a reduction in the productivity.

In order to improved the above-mentioned issues, the present invention has been devised, and its main objective is to provide a semiconductor light-emitting element which can be mounted on a circuit board by using a conductive bonding material, typically represented by solder, at low costs, a manufacturing method and a mounting method for such a semiconductor light-emitting element, as well as a light-emitting device in which such semiconductor light-emitting elements are mounted on a circuit board.

Means for Improving the Issues

In order to achieve the above object, the present invention has the following constitutions.

According to a first aspect of the present invention, there is provided a semiconductor light-emitting element comprising:
a light-transmitting element substrate;
an n-type semiconductor layer formed on the element substrate so as to cover the element substrate;
a p-type semiconductor layer formed so as to cover an area on the n-type semiconductor layer from which an area for an n-electrode on the n-type semiconductor layer is excluded, for emitting light in cooperation with the n-type semiconductor layer;
a first n-electrode that is a thin film formed on the area for the n-electrode of the n-type semiconductor layer;

a first p-electrode that is a thin film formed on the p-type semiconductor layer;

a first insulating layer that is formed so as to insulate the first n-electrode and the first p-electrode from each other;

a second n-electrode formed on the first n-electrode and the first insulating layer as a thin film having an area larger than a joined face between the n-type semiconductor and the first n-electrode so that the second n-electrode is electrically connected to the first n-electrode, the second n-electrode being insulated from the first p-electrode by the first insulating layer; and a second p-electrode formed as a thin film having an area smaller than a joined face between the n-type semiconductor layer and the p-type semiconductor layer, the second p-electrode being electrically connected to the first p-electrode.

According to a second aspect of the present invention, there is provided the semiconductor light-emitting element comprising:

a light-transmitting element substrate;

an n-type semiconductor layer formed on the element substrate so as to cover the element substrate;

a p-type semiconductor layer formed so as to cover an area on the n-type semiconductor layer from which an area for an n-electrode of the n-type semiconductor layer is excluded, for emitting light in cooperation with the n-type semiconductor layer;

a first n-electrode that is a thin film formed on the area for the n-electrode of the n-type semiconductor layer;

a first p-electrode that is a thin film formed on the p-type semiconductor layer;

a first insulating layer having at least one opening for the n-electrode and one opening for the p-electrode formed therein, which covers the first n-electrode and the first p-electrode so as to insulate the first n-electrode and the first p-electrode from each other, except for the opening for the n-electrode and the opening for the p-electrode, a second n-electrode formed on the first insulating layer as a thin film having an area larger than a joined face between the n-type semiconductor layer and the first n-electrode, the second n-electrode being electrically connected to the first n-electrode through the opening for the n-electrode of the first insulating layer; and a second p-electrode formed on the first insulating layer as a thin film having an area smaller than a joined face between the n-type semiconductor layer and the p-type semiconductor layer, the second p-electrode being electrically connected to the first p-electrode through the opening for the p-electrode of the first insulating layer.

According to a third aspect of the present invention, there is provided the semiconductor light-emitting element as defined in the second aspect, wherein a conductive layer that is formed on the first insulating layer on the p-type semiconductor layer so as to have an area that is smaller than the area of the joined face between the n-type semiconductor layer and the p-type semiconductor layer and is larger than the area on the second p-electrode, the conductive layer being electrically connected to the first p-electrode through the opening for the p-electrode of the first insulating layer; and a second insulating layer that is formed between the conductive layer and the second n-electrode so as to insulate the conductive layer and the second n-electrode from each other, wherein the second p-electrode is formed on the conductive layer as a thin film having an area that is larger than the joined face between the p-type semiconductor layer and the first p-electrode and the second p-electrode is electrically connected to the first p-electrode through the conductive layer.

According to a fourth aspect of the present invention, there is provided the semiconductor light-emitting element as defined in the second or third aspects, wherein a plurality of openings for the p-electrode of the first insulating layer are formed so as to be dispersed virtually uniformly.

According to a fifth aspect of the present invention, there is provided the semiconductor light-emitting element as defined in any one of the first to third aspects, wherein the second n-electrode and the second p-electrode have virtually same size.

According to a sixth aspect of the present invention, there is provided the semiconductor light-emitting element as defined in any one of the first to third aspects, wherein the conductive bonding material layer is any one of the members selected from a group consisting of solder, silver paste and anisotropic conductive resin.

According to a seventh aspect of the present invention, there is provided a light-emitting device comprising:

the semiconductor light-emitting element according to the first aspect;

a circuit board having a plurality of electrodes; and a conductive bonding material layer that electrically connects and fixes the second n-electrode and the second p-electrode to the electrodes on the circuit board.

According to an eighth aspect of the present invention, there is provided the light-emitting device as defined in the seventh aspect, wherein the conductive bonding material layer is any one of the members selected from a group consisting of solder, silver paste and anisotropic conductive resin.

According to a ninth aspect of the present invention, there is provided a method for manufacturing a semiconductor light-emitting element comprising:

preparing a bare light-emitting element comprising an n-type semiconductor layer formed on a light-transmitting element substrate so as to cover the element substrate; a p-type semiconductor layer formed on an area on the n-type semiconductor layer from which an area for the n-electrode on the n-type semiconductor layer is excluded, for emitting light in cooperation with the n-type semiconductor layer; a first n-electrode that is a thin film formed on the area for the n-electrode of the n-type semiconductor layer; and a first p-electrode that is a thin film formed on the p-type semiconductor layer;

forming a first insulating layer so as to insulate the first n-electrode and the first p-electrode from each other;

forming a second n-electrode on the first n-electrode and the first insulating layer as a thin film having an area larger than a joined face between the n-type semiconductor and the first n-electrode, so that the second n-electrode is electrically connected to the first n-electrode and is insulated from the first p-electrode by the first insulating layer; and forming a second p-electrode on the first p-electrode as a thin film having an area smaller than a joined face between the n-type semiconductor layer and the p-type semiconductor layer, so that the second p-electrode is electrically connected to the first p-electrode.

According to a tenth aspect of the present invention, there is provided a method for manufacturing a semiconductor light-emitting element comprising:

preparing a bare light-emitting element comprising an n-type semiconductor layer formed on a light-transmitting element substrate so as to cover the element substrate; a p-type semiconductor layer formed on an area on the n-type semiconductor layer from which the area for the n-electrode of the n-type semiconductor layer is excluded, for emitting light in cooperation with the n-type semiconductor layer; a first n-electrode that is a thin film formed on the area for the n-electrode of the n-type semiconductor layer; and a first p-electrode that is a thin film formed on the p-type semiconductor layer;

forming a first insulating layer having at least one of each of an opening for the n-electrode and an opening for the p-electrode so as to cover the first n-electrode and the first p-electrode;

forming, on the first insulating layer, a second n-electrode that is a thin film having an area larger than a joined face between the n-type semiconductor layer and the first n-electrode, so that the second n-electrode is electrically connected to the first n-electrode through the opening for the n-electrode of the first insulating layer; and forming, on the first insulating layer, a second p-electrode that is a thin film having an area smaller than a joined face between the n-type semiconductor layer and the p-type semiconductor layer, so that the second p-electrode is electrically connected to the first p-electrode through the opening for the p-electrode of the first insulating layer.

According to an 11th aspect of the present invention, there is provided the method for manufacturing a semiconductor light-emitting element as defined in the tenth aspect, wherein the first insulating layer is formed through sputtering.

According to a 12th aspect of the present invention, there is provided the method for manufacturing a semiconductor light-emitting element as defined in any one of the ninth to 11th aspects, wherein the second n-electrode and the second p-electrode are formed through sputtering or plating.

According to a 13th aspect of the present invention, there is provided a method for mounting semiconductor light-emitting elements, comprising:

placing solder between the second n-electrode as well as the second p-electrode of the semiconductor light-emitting element according to the first aspect and a plurality of electrodes on a circuit board, and carrying out a reflow treatment thereon, thereby the semiconductor light-emitting elements are mounted on the circuit board through solder.

EFFECTS OF THE INVENTION

In accordance with the semiconductor light-emitting element of the present invention and the manufacturing method and mounting method of the same, since the area on the second n-electrode to be joined to the electrode of a circuit board is made larger than the first n-electrode with the area on the second p-electrode being made smaller than that of the first p-electrode, it becomes possible to carry out a mounting process on a circuit board at low costs by using a conductive bonding material such as solder.

Moreover, in accordance with the light-emitting device of the present invention, since the semiconductor light-emitting element can be mounted on a circuit board at low costs by using a conductive bonding material such as solder, it is possible to achieve high productivity, high junction quality and high yield.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1:
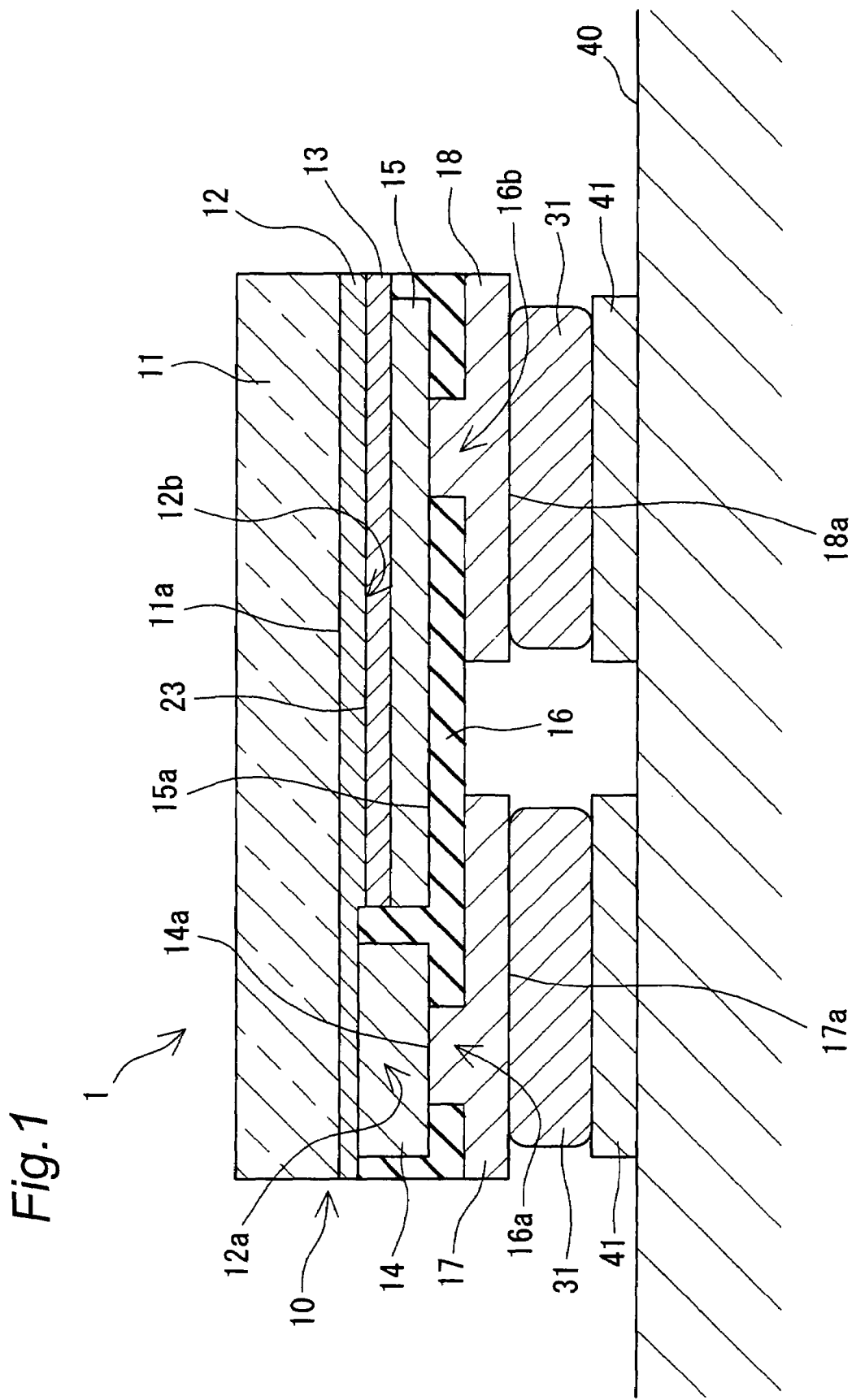
FIG. 1 is a cross-sectional view showing a light-emitting device provided with an LED chip in accordance with a first embodiment of the present invention.

Before the description of the present invention proceeds, it is to be noted that like components are designated by like reference numerals throughout the accompanying drawings.

Referring to Figures, the following description will discuss embodiments in accordance with the present invention in detail.

First Embodiment

Figure 2:
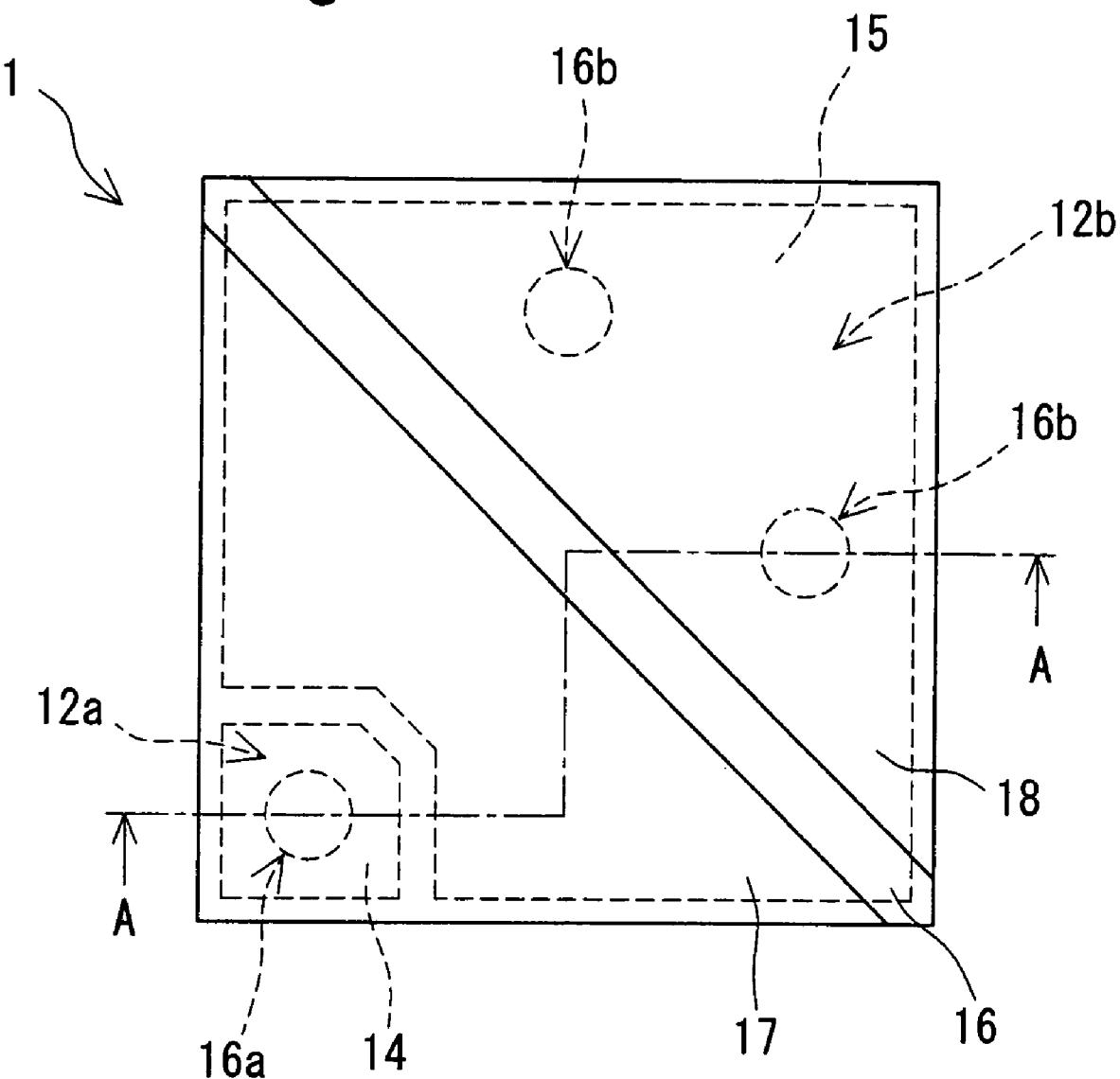
FIG. 2 is a bottom view of the LED chip in accordance with the first embodiment of the present invention.

FIG. 1 is a longitudinal cross-sectional view that shows a light-emitting device in which an LED chip 1, which is one example of a semiconductor light-emitting element in accordance with a first embodiment of the present invention, is mounted on a circuit board 40 through solder 31, which is one example of a conductive bonding material layer, and FIG. 2 is a bottom view of the LED chip 1. FIG. 1 schematically shows a cross section taken along line A-A in FIG. 2. Here, in the cross-sectional view of FIG. 1, for convenience of explanation, one portion thereof is indicated in an exaggerated manner. The following explanation will be given so as to laminate respective layers and respective electrodes downward in the Figure.

Figure 3:
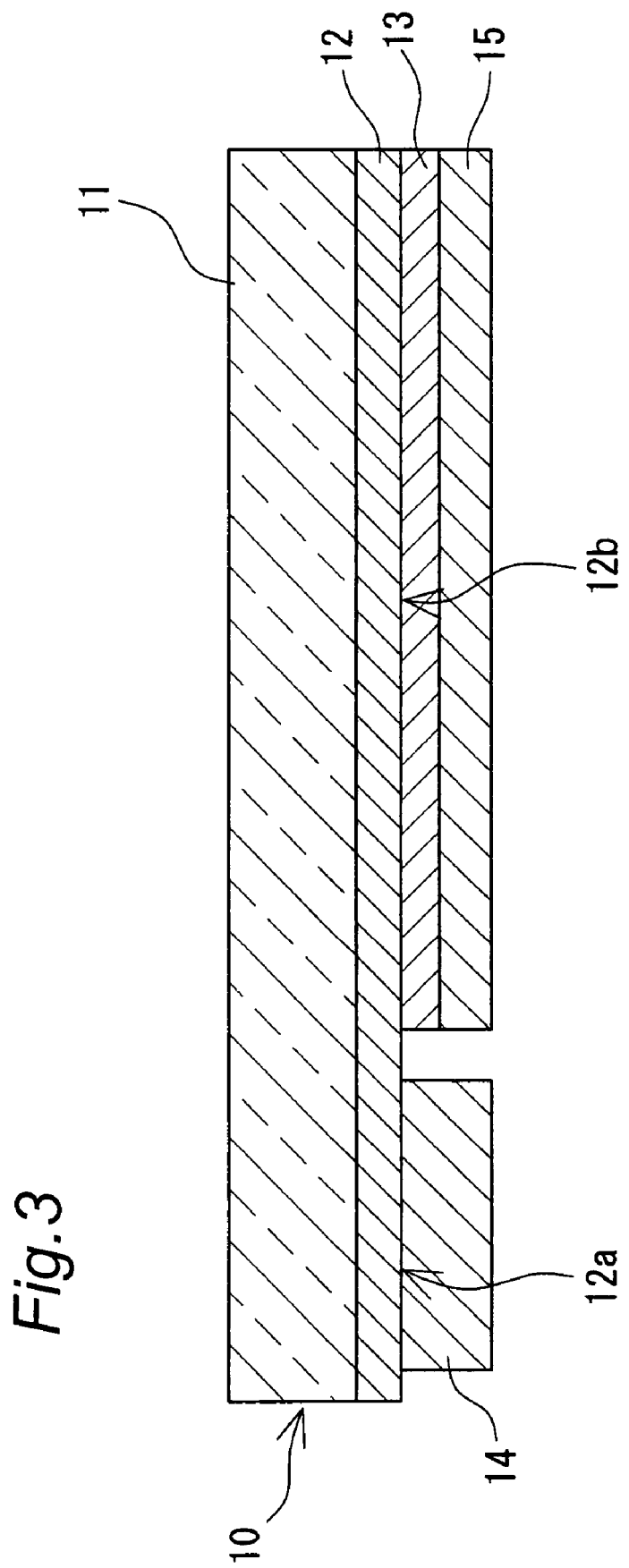
FIG. 3 is a cross-sectional view showing a bare chip in accordance with the first embodiment of the present invention.

In FIG. 1, the LED chip 1 is provided with a bare chip 10 (see FIG. 3) including an element substrate 11, an n-type semiconductor layer 12 formed on the element substrate 11 so as to cover the element substrate 11, a p-type semiconductor layer 13 formed on an area 12b for the p-type semiconductor layer of the n-type semiconductor layer 12 from which a corner area 12a for an n-electrode is excluded, a first n-electrode 14 formed on the area 12a for the n-electrode and a first p-electrode 15 formed on the p-type semiconductor layer 13.

Moreover, the LED chip 1 is provided with a first insulating layer 16 formed so as to cover the first n-electrode 14 and the first p-electrode 15, and is formed so as to insulate the first n-electrode 14 and the first p-electrode from each other, a second n-electrode 17 that is formed on the first insulating layer 16 (that is, the lowest side of the LED chip 1 in FIG. 1), and penetrates the first insulating layer 14 to be electrically connected to the first n-electrode 14 and a second p-electrode 18 that is electrically connected to the first p-electrode 15.

The element substrate 11 is a light transmitting substrate having a virtually regular square shape, which is made of, for example, sapphire. The n-type semiconductor layer 12 is formed so as to cover the entire face of the lower face 11a (in FIG. 1) of the element substrate 11. The p-type semiconductor layer 13 is formed so as to cover the area 12b for the p-type semiconductor layer of the n-type semiconductor layer 12. The first n-electrode 14 is formed by a thin film having a thickness, for example, in a range from 0.1 μm to 0.3 μm, through sputtering, plating or the like, so as to cover virtually the entire face of the area 12a for the n-electrode. The area 12a for the n-electrode is prepared as an area that is sufficiently smaller than the area 12b for the p-type semiconductor layer (for example, 10% of the area for the p-type semiconductor layer), as shown in FIG. 2, so as to allow the area on a p-n junction 23 forming a light-emitting face to become sufficiently large. The first p-electrode 15 is formed by a thin film having a thickness, for example, in a range from 0.1 μm to 0.3 μm, through sputtering, plating or the like, so as to cover virtually the entire face of the p-type semiconductor layer 13. The lower face 14a of the first n-electrode 14 and the lower face 15a of the first p-electrode 15 are formed to be set in virtually the same level in height, based upon the lower face 11a of the element substrate 11.

In order to restrain electric leakage and electrostatic breakdown, the first insulating layer 16 is formed so as to cover virtually the entire face including a gap between the first n-electrode 14 and the first p-electrode 15, the lower face 14a of the first n-electrode 14 and the lower face 15a of the first p-electrode 15. Here, since the first insulating layer 16 is formed in this manner, the second n-electrode 17, which will be described later, is prevented from being connected to the first p-electrode 15. In other words, the second n-electrode 17, which will be described later, is insulated from the first p-electrode 15. The first insulating layer 16 is formed by an oxide film, a nitride film or the like of silicon, with a thickness, for example, in a range from 0.1 μm to 1.0 μm. An opening 16a for the n-electrode and a plurality of openings 16b for the p-electrode are respectively formed on the first insulating layer 16.

Each of the second n-electrode 17 and the second p-electrode 18 is formed on the first insulating layer 16 through sputtering, plating or the like, by a thin film having a thickness, for example, in a range from 0.1 μm to 0.3 μm, and as shown in FIG. 2, these are designed to form isosceles triangles that have virtually the same size, and are placed so as to face each other across one of the diagonal lines of the element substrate 11. In other words, the lower face 17a of the second n-electrode 17 is allowed to have an area larger than the joined face between the n-type semiconductor layer 12 and the first n-electrode 14, and the lower face 18a of the second p-electrode 18 is consequently formed into an area smaller than the joined face between the n-type semiconductor layer 12 and the p-type semiconductor layer. In other words, in the LED chip 1, the first n-electrode 14 and the first p-electrode 15 are respectively replaced by the second n-electrode 17 and the second p-electrode 18 that are formed into virtually the same size. Moreover, the second n-electrode 17 is electrically connected to the first n-electrode 14 through the opening 16a for the n-electrode of the first insulating layer 16, and the second p-electrode 18 is electrically connected to the first p-electrode 15 through a plurality of the openings 16b for the p-electrode. In this case, the lower face 17a of the second n-electrode 17 and the lower face 18a of the second p-electrode 18 are formed to be set in virtually the same level in height, based upon the element substrate 11. Here, on each of the layers and each of the interfaces of the LED chip 1, another layer or film that is extremely thin may be formed on demand to reinforce the joint between the electrode and the surface and to reinforce the insulation.

The LED chip 1 in accordance with the first embodiment is arranged as described above.

In the LED chip 1 that is constructed as described above, as shown in FIG. 1, the second n-electrode 17 and the second p-electrode 18 are electrically connected and fixed onto the electrode 41 on the circuit board 40 through solder 31 that is one example of the conductive bonding material layer. Thus, the light-emitting device provided with the LED chip 1 in accordance with the first embodiment is completed.

Figure 4:
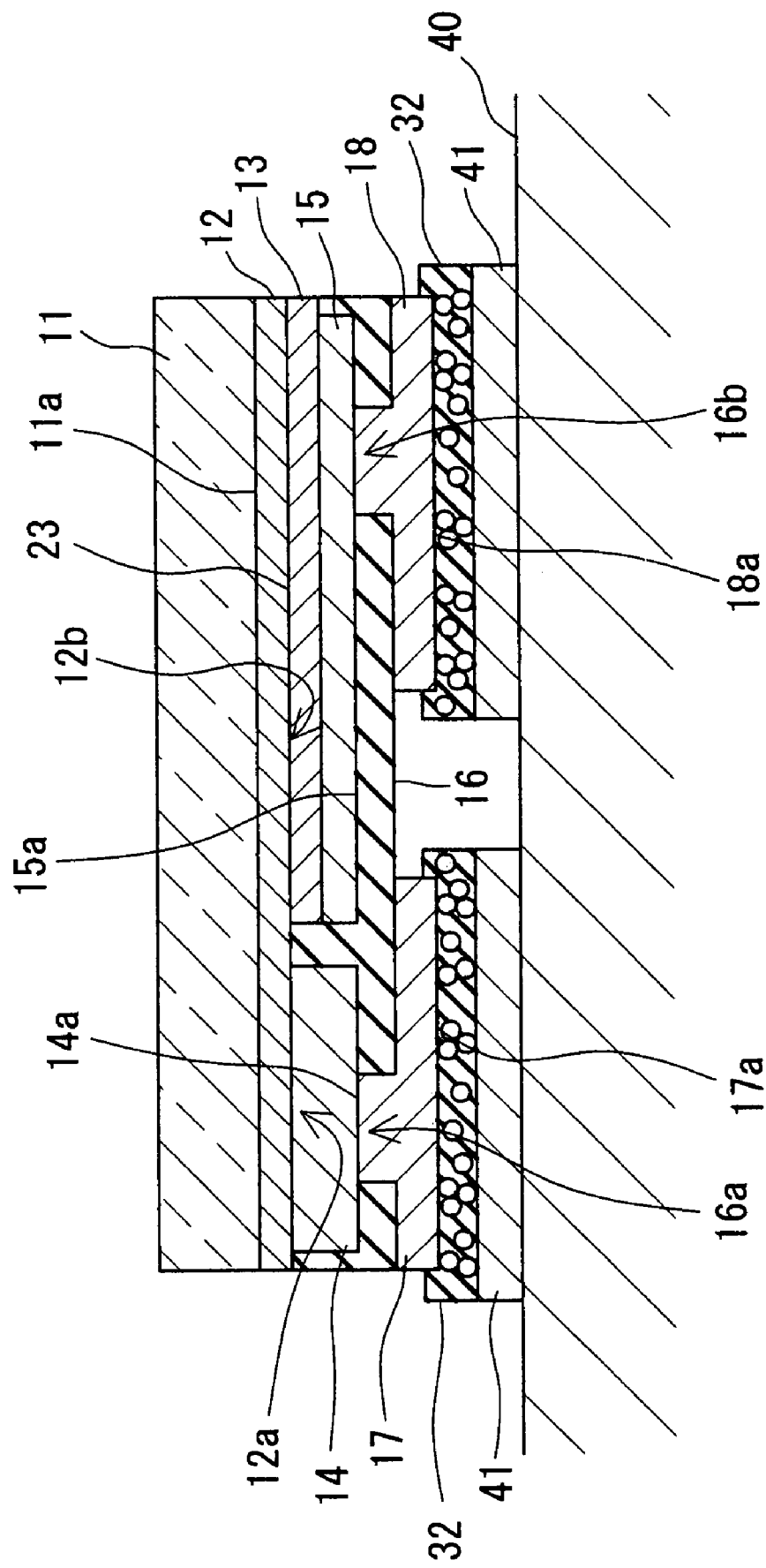
FIG. 4 is a cross-sectional view showing another light-emitting device provided with the LED chip in accordance with the first embodiment of the present invention.

Here, the sizes (areas) of the second n-electrode 17 and the second p-electrode 18 are determined as sizes that can be mounted on the circuit board 40 in accordance with the conductive bonding material layer, such as solder 31 and anisotropic conductive resin, used for the joining process. For example, in the case when the solder 31 is used as the conductive bonding material, the sizes of the second n-electrode 17 and the second p-electrode 18 are respectively prepared based upon a level of 0.1 mm or more in width and 0.04 mm$^2$ or more in area. Moreover, as shown in FIG. 4, in the case when an anisotropic conductive resin 32 is used as the conductive bonding material, the sizes of the second n-electrode 17 and the second p-electrode 18 are respectively prepared based upon a level of 0.20 mm or more in width and 0.08 mm$^2$ or more in area, and an area in the anisotropic conductive resin 32 with which metal particles come into contact to allow a current to flow is preferably set to 5% or more of the above-mentioned area.

In the light-emitting device provided with the LED chip 1 in accordance with the first embodiment, a current is applied between the second n-electrode 17 and the second p-electrode 18 through the circuit board 40 so that light is generated between the n-type semiconductor layer 12 and the p-type semiconductor layer 13. The light thus generated is emitted upward and sideward in FIG. 1 through the element substrate 11.

With respect to the openings 16b for the p-electrode formed on the first insulating layer 16, since the distribution of a current density in the interlayer between the n-type semiconductor layer 12 and p-type semiconductor layer 13 gives an influence to the light-emitting intensity, a plurality of the openings 16b are preferably formed so as to be dispersed virtually uniformly. With this arrangement, the uniformity of the distribution of the light-emitting intensity is improved, and the luminance of the LED chip 1 is efficiently improved.

Here, in the LED chip 1 of the first embodiment, the second n-electrode 17 and the second p-electrode 18 are designed to form isosceles triangles that have virtually the same size, and are placed so as to face each other across one of the diagonal lines of the element substrate 11; however, the present invention is not intended to be limited by this structure. The second n-electrode 17 and the second p-electrode 18 may be at least designed to have virtually the same size, and are placed so as to face each other across a line passing through the center of the LED chip 1, and for example, the second n-electrode 17 and the second p-electrode 18 may have a rectangular shape.

Here, the second n-electrode 17 and the second p-electrode 18 may be designed to have different sizes (areas); however, the formation having virtually the same size is less likely to cause issues such as a tilt in the LED chip 1 upon mounting onto the circuit board 40 and the occurrence of a Manhattan phenomenon. Moreover, in the case when a conductive bonding material such as the solder 31 that requires a wide joining area is used, the formation having virtually the same size is more advantageous than the arrangement in which the second n-electrode 17 and the second p-electrode 18 are made to have different sizes with one of them formed into a smaller size, in that a higher mounting precision is not required. Moreover, since high mounting precision is not required, it is possible to improve the production efficiency and consequently to improve the productivity. Here, the mounting time for one conventional LED chip is about 1.0 second, while the mounting time for one LED chip 1 of the first embodiment is 0.1 second or less; thus, the improvement in productivity of about 10 times or more has been confirmed.

Figure 5:
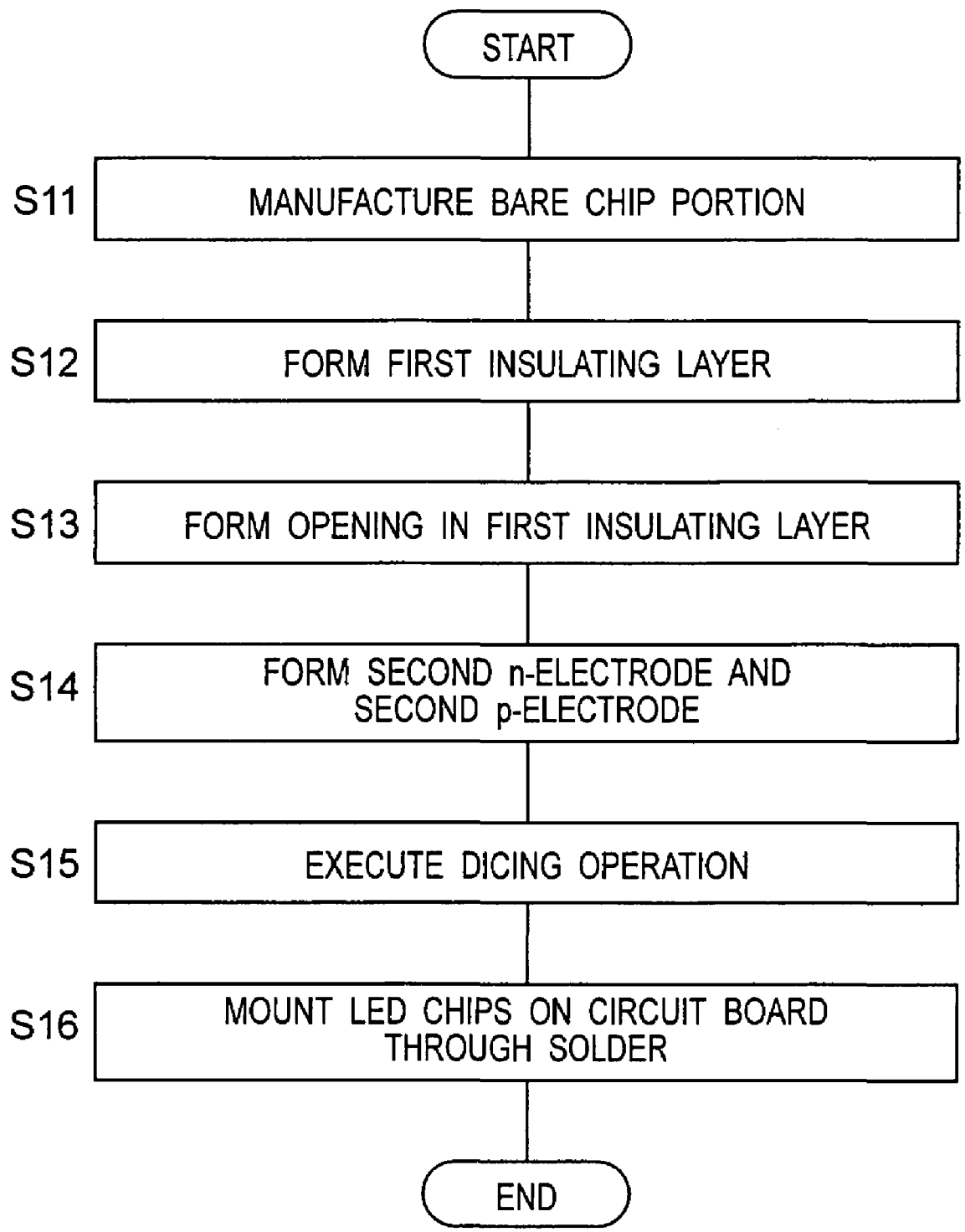
FIG. 5 is a flow chart that shows a manufacturing method and a mounting method for an LED chip.
Figure 6:
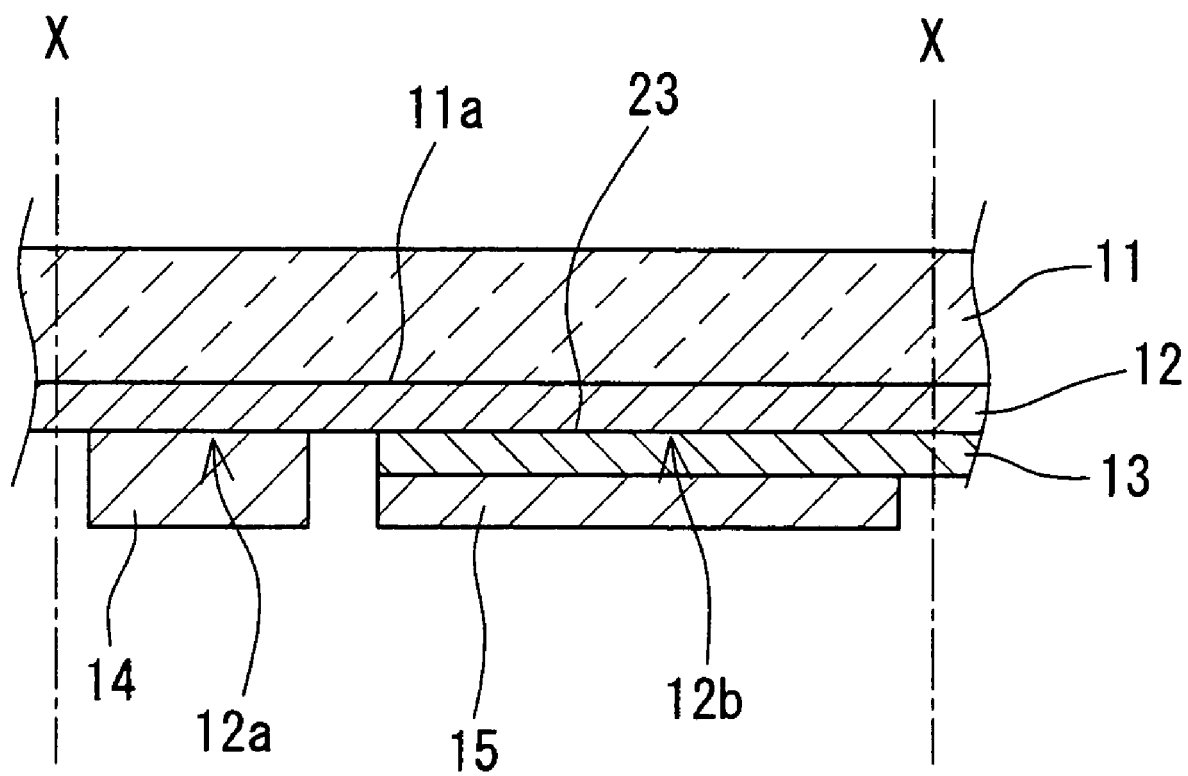
FIG. 6 is a cross-sectional view used for explaining a manufacturing method for an LED chip in accordance with the first embodiment of the present invention.
Figure 7:
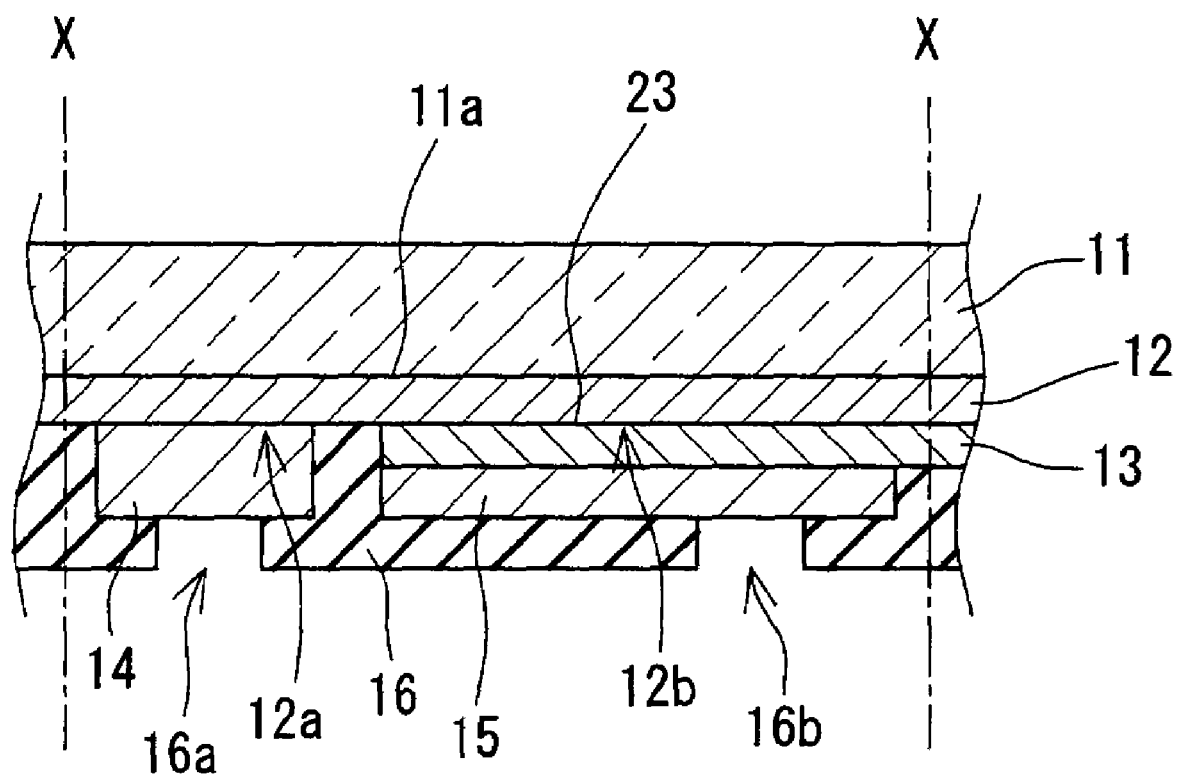
FIG. 7 is a cross-sectional view used for explaining a manufacturing method for the LED chip in accordance with the first embodiment of the present invention.
Figure 8:
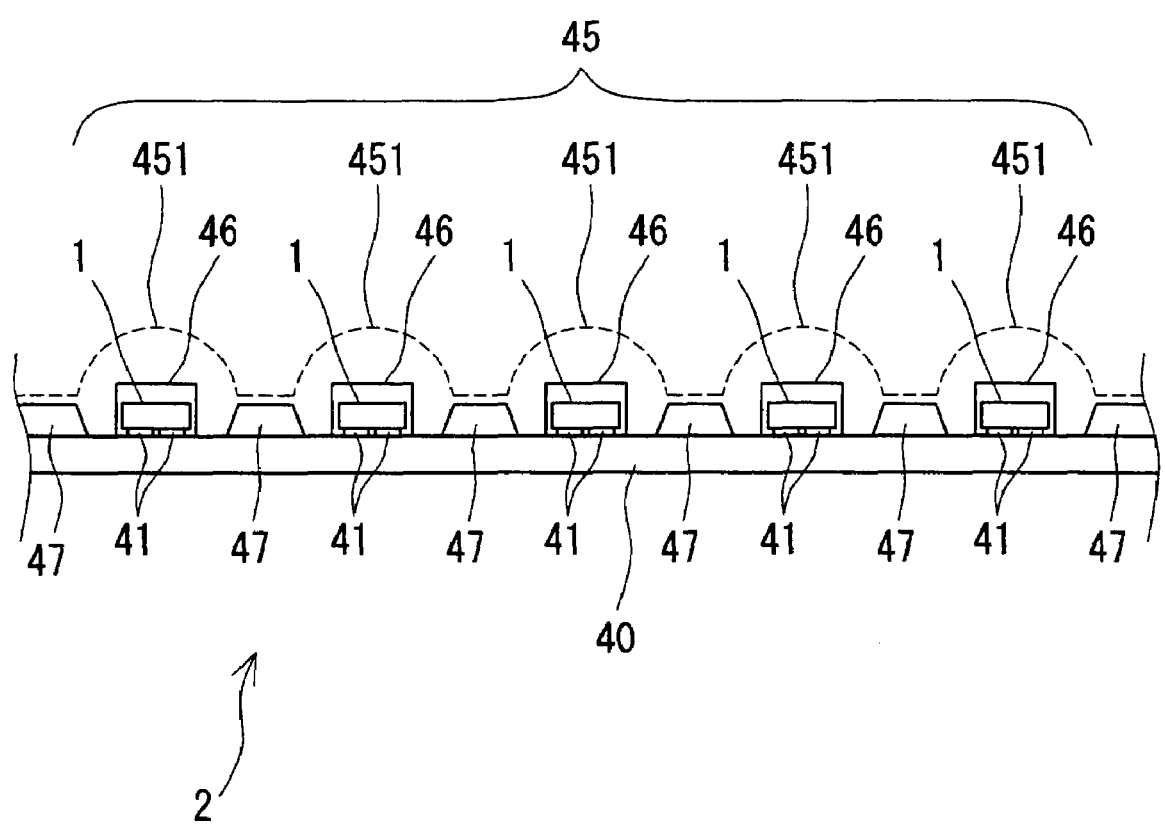
FIG. 8 is a drawing that shows an LED light source using a number of LED chips in accordance with the first embodiment of the present invention.

Referring to FIGS. 5 to 7, the following description will discuss a manufacturing method and a mounting method for the LED chip 1. FIG. 5 is a flow chart that shows the manufacturing method and the mounting method for the LED chip 1. FIG. 6 and FIG. 7 are cross-sectional views that show manufacturing processes of the LED chip 1. In FIG. 6 and FIG. 7, one-dot chain lines X, X indicate positions to be cut by the succeeding dicing process.

First, through manufacturing processes carried out in the same manner as the normal LED chip, a joined body of the bare chips 10 is formed as shown in FIG. 6 (step S11).

More specifically, in the manufacturing method for the joined body of the bare chips 10, first, an n-type semiconductor layer 12 is formed so as to cover the entire face of the lower face 11a of a joined body of a plate-like light-transmitting element substrate 11 formed by, for example, sapphire. Next, a p-type semiconductor layer 13 is formed on an area 12b for the p-type semiconductor layer of the n-type semiconductor layer 12 from which the area 12a for the n-electrode of the n-type semiconductor layer 12 is excluded. Next, after some thin films (thin films or the like that reinforce the joining between the electrode and the face) have been formed on the area 12a for the n-electrode through sputtering on demand, the first n-electrode 14 serving as a metal thin film is further formed thereon through sputtering, and after some thin films have also been formed on the p-type semiconductor layer 13 on demand, the first p-electrode 15 serving as a metal thin film is formed thereon.

After the joined body of the bare chips 10 has been prepared as described above, the first insulating layer 16 is next formed through sputtering so as to cover virtually the entire surface of the first n-electrode 14 and the first p-electrode 15 (step S12). Next, resist is applied, and then exposed and developed so that, as shown in FIG. 7, an opening 16a for the n-electrode that communicates with the first n-electrode 14 and an openings 16b for the p-electrode that communicates with the first p-electrode 15 are formed in the first insulating layer 16 (step S13).

Next, after having formed a metal thin film of gold, copper or the like on the first insulating layer 16 through sputtering, if necessary, a thin film of titanium, chromium or the like is preliminarily formed so as to reinforce adhesion of the electrode. Next, the metal thin film, formed on the first insulating layer 16, is equally divided through a photolithography method so that the second n-electrode 17 that is a thin film having an area larger than the joining face between the n-type semiconductor layer 12 and the first n-electrode 14 is formed on the first insulating layer 16 and the second p-electrode 18 that is a thin film having an area smaller than the joining face between the n-type semiconductor layer 12 and the p-type semiconductor layer 13 is also formed thereon (step S14). With this arrangement, the joined body of the LED chip 1 is completed. Here, the second n-electrode 17 and the second p-electrode 18 are easily formed in the succeeding step of the production of the bare chip 10 through sputtering (and another additional process such as etching). Moreover, since the first insulating layer 16 is an extremely thin layer, the second n-electrode 17 and the second p-electrode 18 are electrically connected to the first n-electrode 14 and the first p-electrode 15 respectively through the opening 16a for the n-electrode and the openings 16b for the p-electrode, when simply placed on the first insulating layer 16.

Next, the joined body of the LED chip 1, manufactured as described above, is cut by dicing at the position of the one dot chain line X-X shown in FIGS. 6 and 7 into each LED chip 1 one by one (step S15). Thus, the manufacturing process of the LED chip 1 is completed. Here, it has been explained that in the manufacturing process of the LED chip 1, the second n-electrode 17 and the second p-electrode 18 are formed through sputtering; however, these electrodes may be formed through plating (and an additional process).

Next, the LED chip 1 is attached onto cream-state solder or plating solder that is formed on the electrode 41 on the circuit board 40 by printing or plating, and this is subjected to a reflow treatment. Thus, as shown in FIG. 1, the second n-electrode 17 and the second p-electrode 18 are electrically connected and fixed onto the electrode 41 on the circuit board 40 through the solder 31 (step S16). As described above, the LED chip 1 is mounted on the circuit board 40.

In accordance with the first embodiment, since the second n-electrode 17 and the second p-electrode 18 of the LED chip 1 are set to a size that covers about half the LED chip 1, it is not necessary to achieve high mounting precision as required in the case of the flip-chip junction in which bumps are utilized, and the mounting process can be easily executed at low costs, by using a conductive bonding material layer such as solder, silver paste and anisotropic conductive resin. Thus, a light-emitting device in which the LED chip 1 is mounted makes it possible to achieve, high junction quality, high yield and high productivity.

Moreover, when the LED chip is allowed to emit light, generated heat reaches about 80° C., and in the conventional mounting technique through the above-mentioned flip-chip junction, since the contact area between the LED chip and the circuit board is small (only bumps), the resulting issue is that the heat of the LED chip is not sufficiently released. However, in accordance with the first embodiment, the joining area between the LED chip 1 and the circuit board 40 by connecting the first n-electrode 14 to be connected to the n-type semiconductor layer 12 to the second n-electrode 17 so that the joining strength to the circuit board 40 is increased and the heat releasing property is also improved because the joining area between the LED chip 1 and the circuit board 40 is expanded. Moreover, since the first n-electrode 14 and the first p-electrode 15 are covered with the first insulating layer 16, it is possible to restrain electrical leak and electrostatic breakdown.

Moreover, in accordance with the first embodiment of the present invention, in particular, when a number of LED chips 1 are mounted on the circuit board 40 at high density, a large-size LED chip 1 (for example, 1 mm or more) can be fixed as one lot, making it possible to further cut the production costs. When, onto the circuit board 40 on which a number of large-size LED chips 1 are mounted at a high density (for example, in a lattice shape or a staggered shape) as described above, for example, a lens array 45 having micro-lenses 451 corresponding to the respective LED chips 1, phosphors 46 and reflection plates 47 corresponding to the respective LED chips 1 are attached, the resulting device can be utilized as an LED light source 2 for illumination, such as a middle/large-sized liquid crystal back light, a special illuminating device and a car headlight.

Second Embodiment

Figure 9:
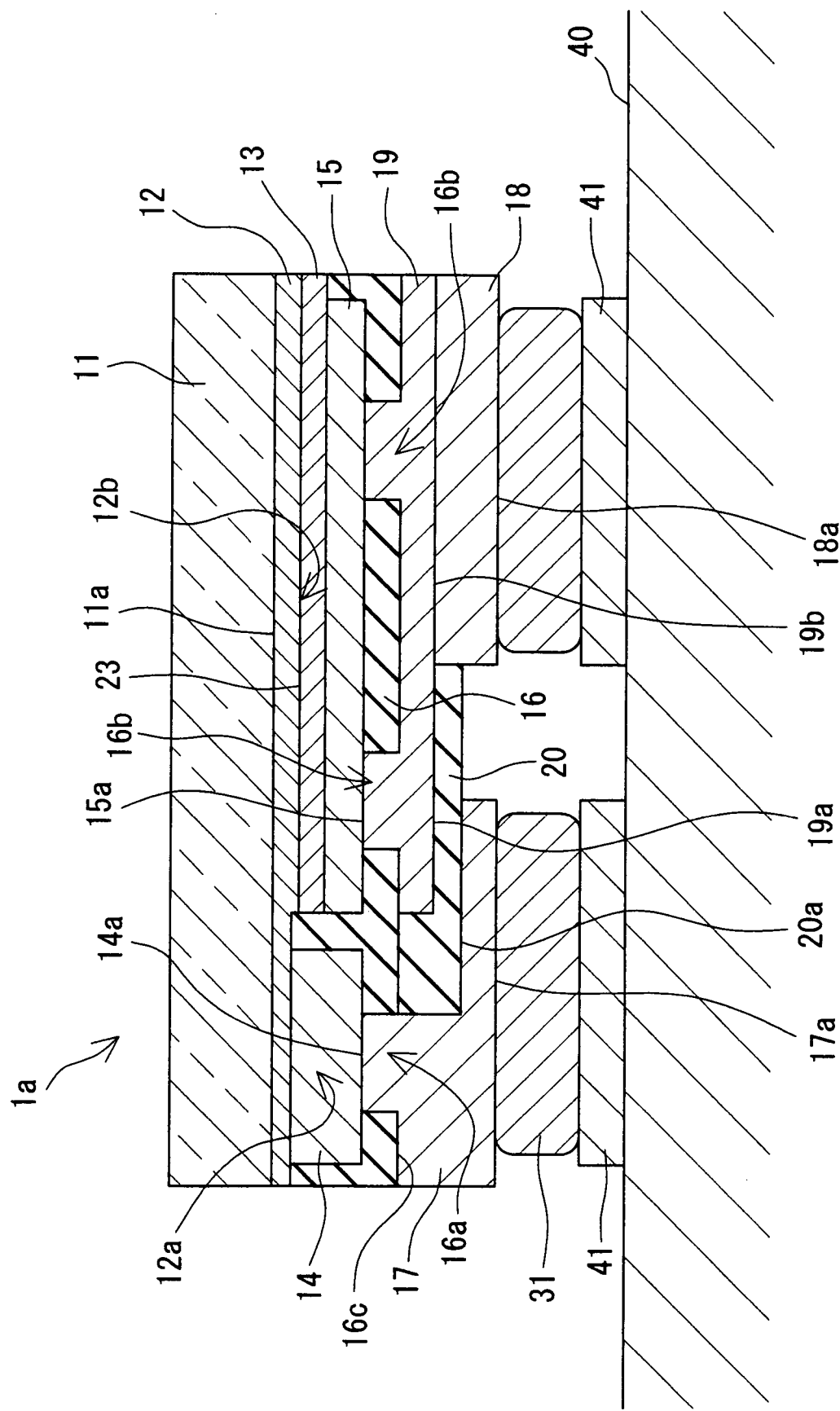
FIG. 9 is a cross-sectional view of a light-emitting device provided with an LED chip in accordance with a second embodiment of the present invention.
Figure 10:
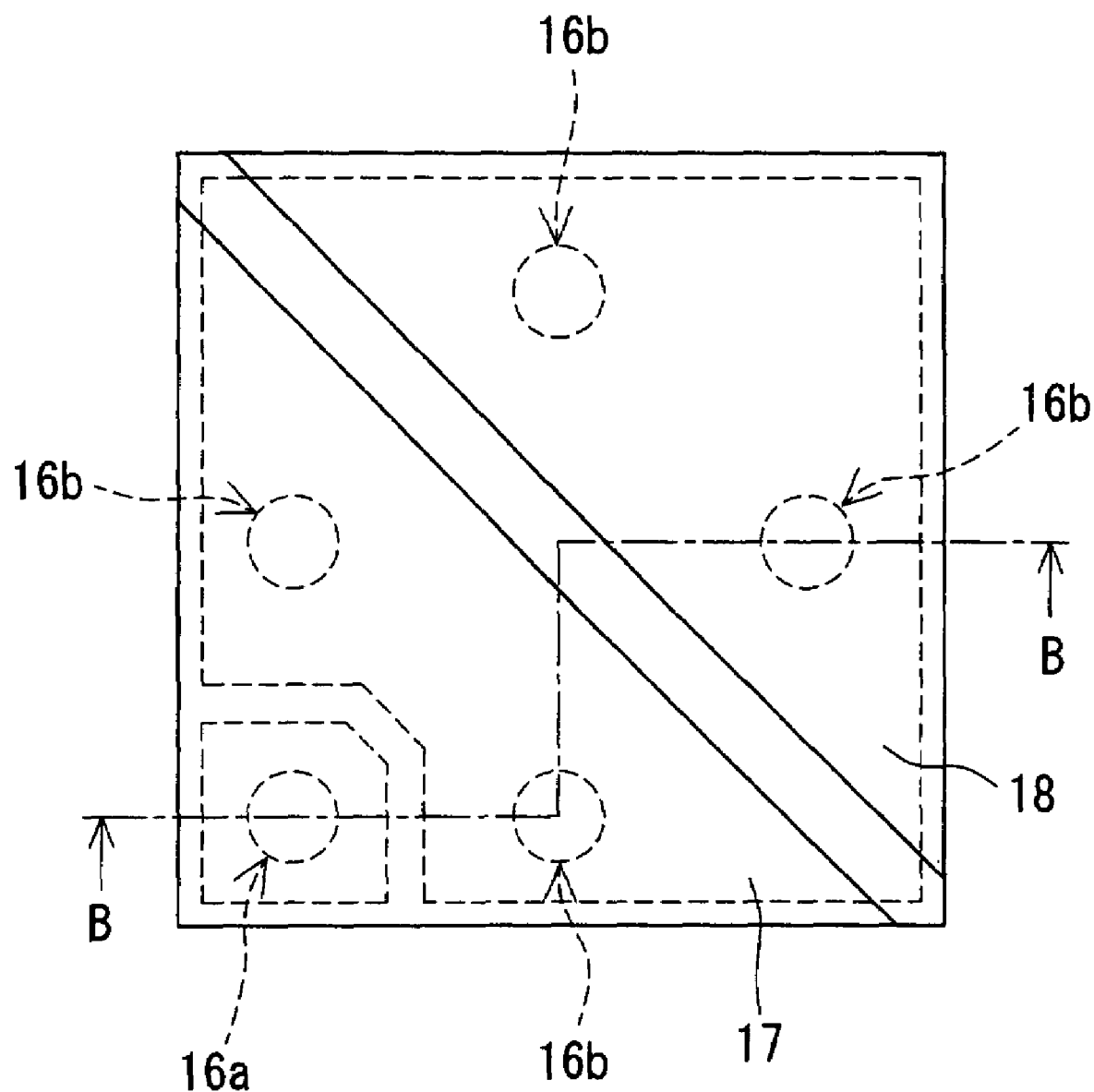
FIG. 10 is a bottom view of the LED chip in accordance with the second embodiment of the present invention.
Figure 11:
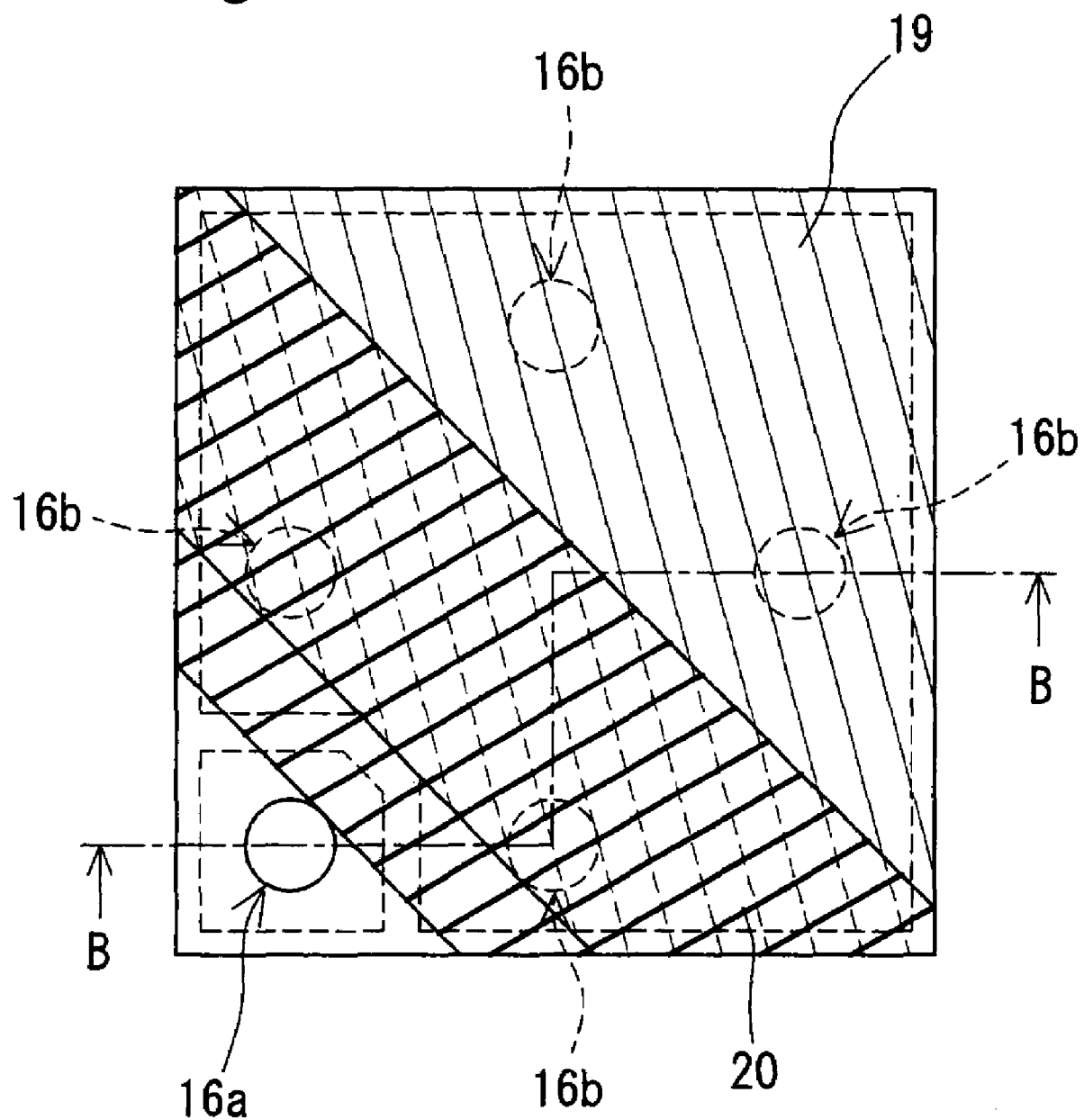
FIG. 11 is a bottom view showing the LED chip from which electrodes have been detached, in accordance with the second embodiment of the present invention.

FIG. 9 is a longitudinal cross-sectional view that shows a light-emitting device in which an LED chip 1*a* in accordance with a second embodiment of the present invention, is mounted on a circuit board 40 through solder 31, which is one example of a conductive bonding material layer. FIG. 10 is a bottom view of the LED chip 1*a*, and FIG. 11 is a bottom view in a state before the formation of the second n-electrode 17 and the second p-electrode 18 of the LED chip 1*a*. FIG. 9 is a drawing that schematically shows a cross section at a position of line B-B in FIG. 10 and FIG. 11. Here, in the cross-sectional view of FIG. 9, for convenience of explanation, one portion thereof is indicated in an exaggerated manner. Moreover, a portion with slanting lines in FIG. 11 is not given to indicate cross-sectional lines, but given to help understanding of the areas of the conductive layer 14 (portion with thin slanting lines) and a second insulating layer (portion with thick slanting lines).

The LED chip 1*a* of the second embodiment is different from the LED chip 1 of the first embodiment in that a conductive layer 19 and a second insulating layer 20 are further formed. Since the other points are the same, with respect to members indicated by the same reference numerals, the overlapped explanations will be omitted.

As shown in FIGS. 9 and 11, the conductive layer 19 (portion with thin slanting lines in FIG. 11) is formed on the first insulating layer 16 above the p-type semiconductor layer 13 with an area that is smaller than the joining face between the n-type semiconductor layer 12 and the p-type semiconductor layer 13, and larger than the area on the second p-electrode 18, and electrically connected to the first p-electrode 15 through a plurality of openings 16*b* for the p-electrode of the first insulating layer 16. The conductive layer 19 is a thin film having a thickness, for example, in a range from 0.1 μm to 0.3 μm, and is formed through sputtering and plating.

The second insulating layer 20 (portion with thick slanting lines of FIG. 11) is formed between the second n-electrode and the conductive layer 16 so as to insulate the second n-electrode 17 and the conductive layer 16 from each other. In other words, the second insulating layer 20 is formed on an area 19*a* on the side of the first insulating layer 16 and the first n-electrode 14 so as to cover the area 19*a* on the first n-electrode 14 side rather than the second p-electrode 18 of the conductive layer 19. The second insulating layer 20 is formed by a thin film having a thickness, for example, in a range from 0.1 μm to 1.0 μm, through sputtering, plating or the like. The second p-electrode 18 is formed on an area 19*b* that is not covered with the second insulating layer 20 of the conductive layer 19 so as to be electrically connected to the first p-electrode 15 through the conductive layer 19 and the opening 16*b* for the p-electrode of the first insulating layer 16.

In accordance with the LED chip 1*a* of the second embodiment, as shown in FIGS. 9 to 11, even when the openings 16*b* for the p-electrode of the first insulating layer 16 are formed at positions overlapping with the second n-electrode 17 when viewed from the bottom side of the LED chip 1*a*, the first p-electrode 15 and the second p-electrode 18 can be electrically connected with each other at many portions through the openings 16*b* for the p-electrode and the conductive layer 19. Therefore, in comparison with the LED chip 1 of the first embodiment, a plurality of openings 16*b* for the p-electrode are formed in more dispersed manner so that an electric current can be supplied sufficiently to the entire first p-electrode 15, thereby making it possible to further improve the uniformity of light emission of the LED chip 1*a*. Moreover, since the area on the second n-electrode 17 needs not be made smaller, it is possible to use a conductive bonding material such as solder that requires a wider joining area.

Figure 12:
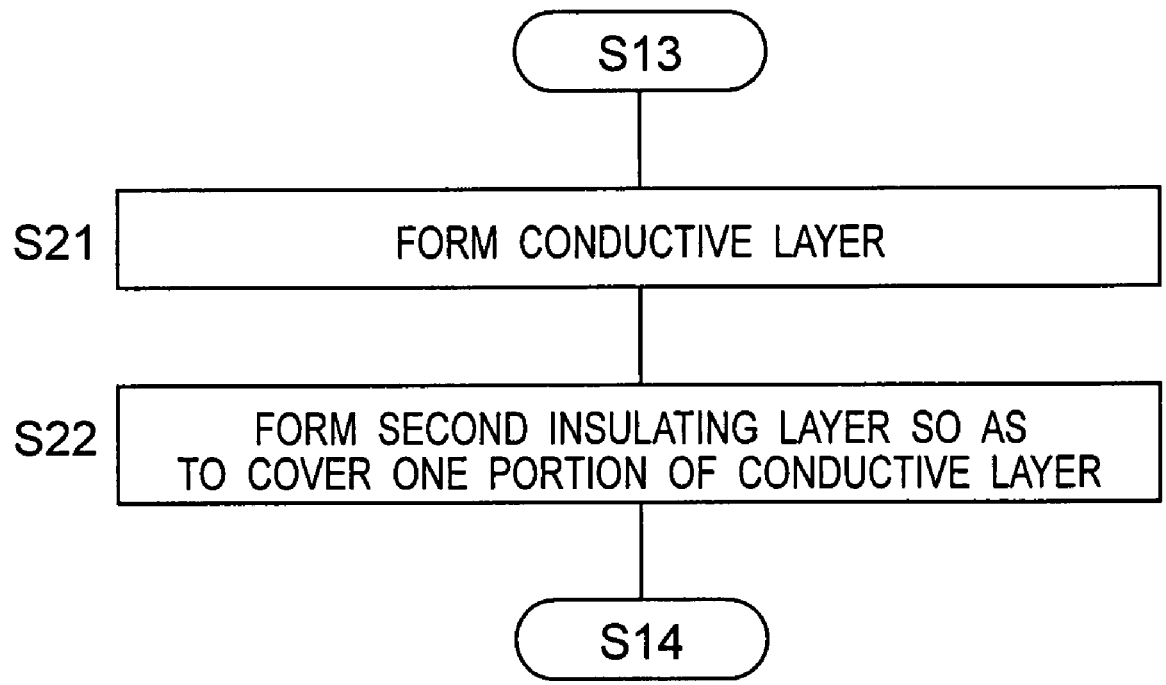
FIG. 12 is a flow chart that shows a manufacturing method for the LED chip in accordance with the second embodiment of the present invention.

Here, upon manufacturing the LED chip 1*a*, as shown in FIG. 12, a step can be added between the step S13 and the step S14 of FIG. 5, in which: after having formed the conductive layer 19 (step S21) on the first insulating layer 16 through sputtering or the like, the second insulating layer 20 (step S22) is formed so as to cover the area 19*a* on the first n-electrode 14 side of the conductive layer 19.

Here, in the second embodiment, the conductive layer 19 and the second n-electrode 18 are formed separately; however, these may be formed integrally.

Figure 13:
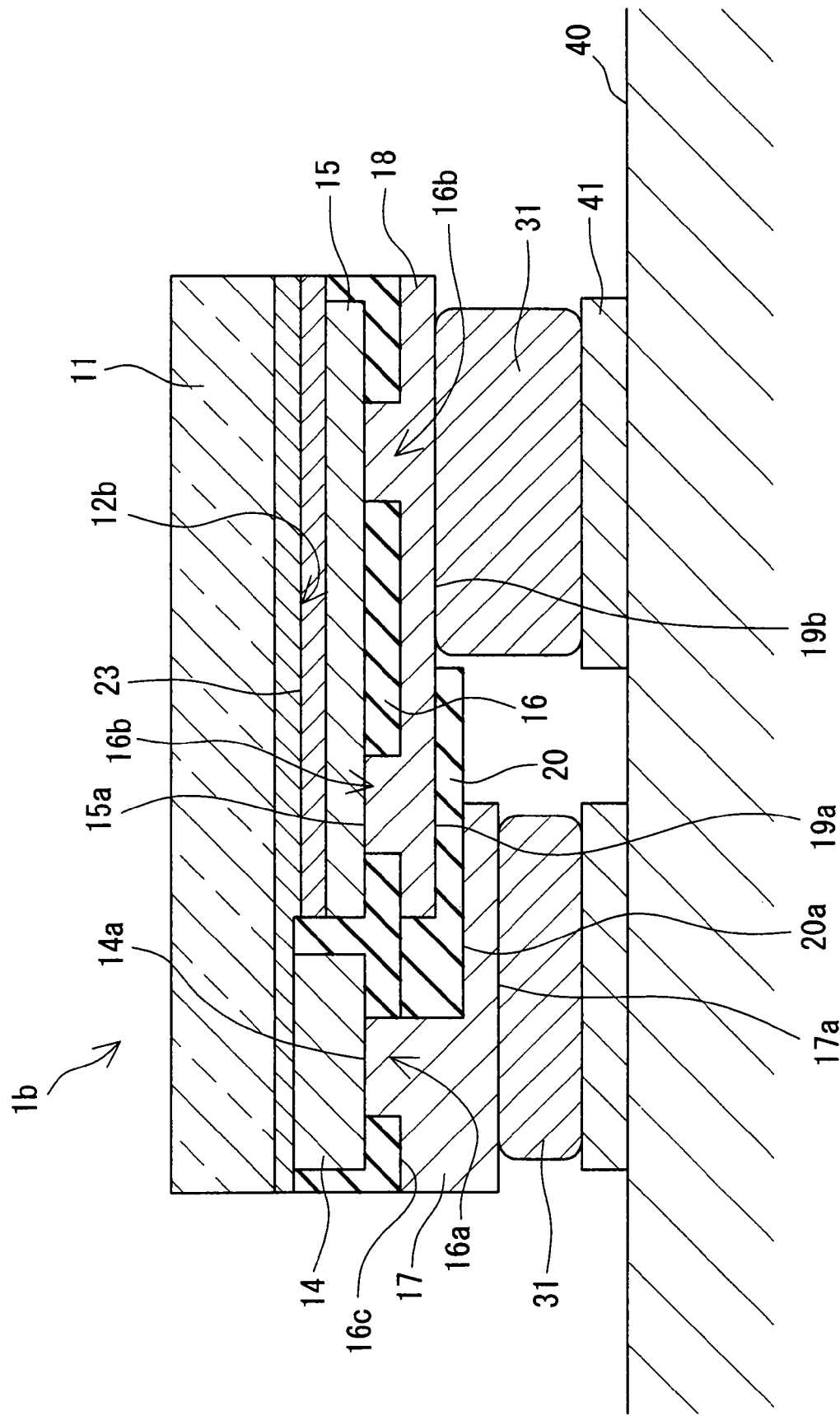
FIG. 13 is a cross-sectional view of a light-emitting device provided with another LED chip in accordance with the second embodiment of the present invention.

Moreover, in the case where the height from the element substrate 11 to the lower face 17*a* of the second electrode 17 and the height from the element substrate 11 to the lower face 18*a* of the second p-electrode 18 need not be made equal to each other, that is, for example, in the case when the mounting process can be executed while the orientation of the LED chip 1*b* is regulated, as shown in FIG. 13, provision may be made so that the joining process is directly carried out on the area 19*b* that is not covered with the second insulating layer 20 of the conductive layer 19 through the solder 31.

Figure 14:
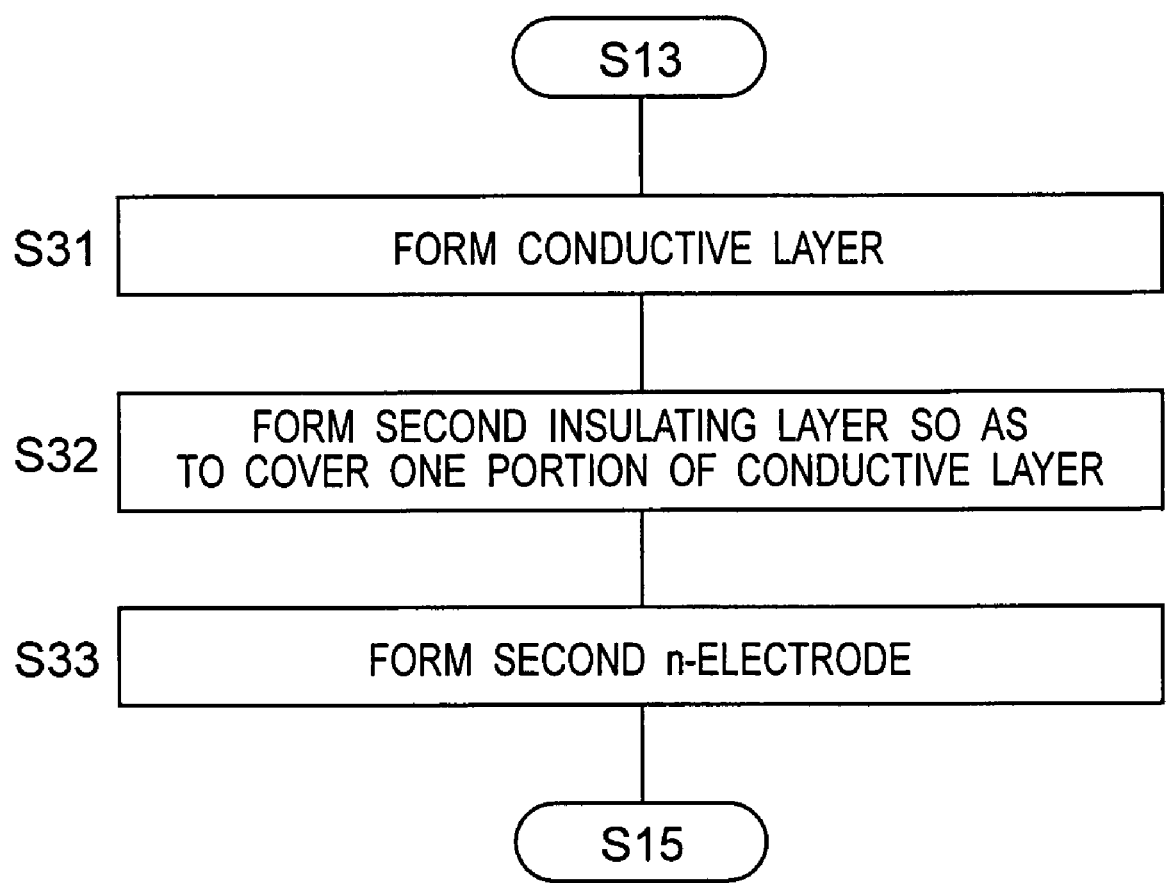
FIG. 14 is a flow chart that shows a manufacturing method for another LED chip in accordance with the second embodiment of the present invention.

Upon manufacturing the LED chip 1*b* having the above-mentioned structure, as shown in FIG. 14, instead of the step S14 of FIG. 5, the following steps may be added: after forming the conductive layer 19 (step S31) on the first insulating layer 16 through sputtering or the like, the second insulating layer 20 is formed so as to cover the area 19*a* of the conductive layer 19 on the first n-electrode 14 side through sputtering or the like (step S32), and the second n-electrode 17 is formed so as to cover the area 16*c* covering the first n-electrode 14 of the first insulating layer 16 and the area 20*a* of the second insulating layer 20 on the first n-electrode 14 side (step S33) through sputtering, plating or the like.

The first and second embodiments of the present invention have been explained above; however, the present invention is not intended to be limited by the first and second embodiments, and can be modified in many ways.

For example, in Figures, the opening 16*a* for the n-electrode and the openings 16*b* for the p-electrode to be formed on the first insulating layer 16 are designed to have a round shape; however, an opening having a cut-out shape (that is, connected to the edge of the first insulating layer 16) may be used.

Figure 15:
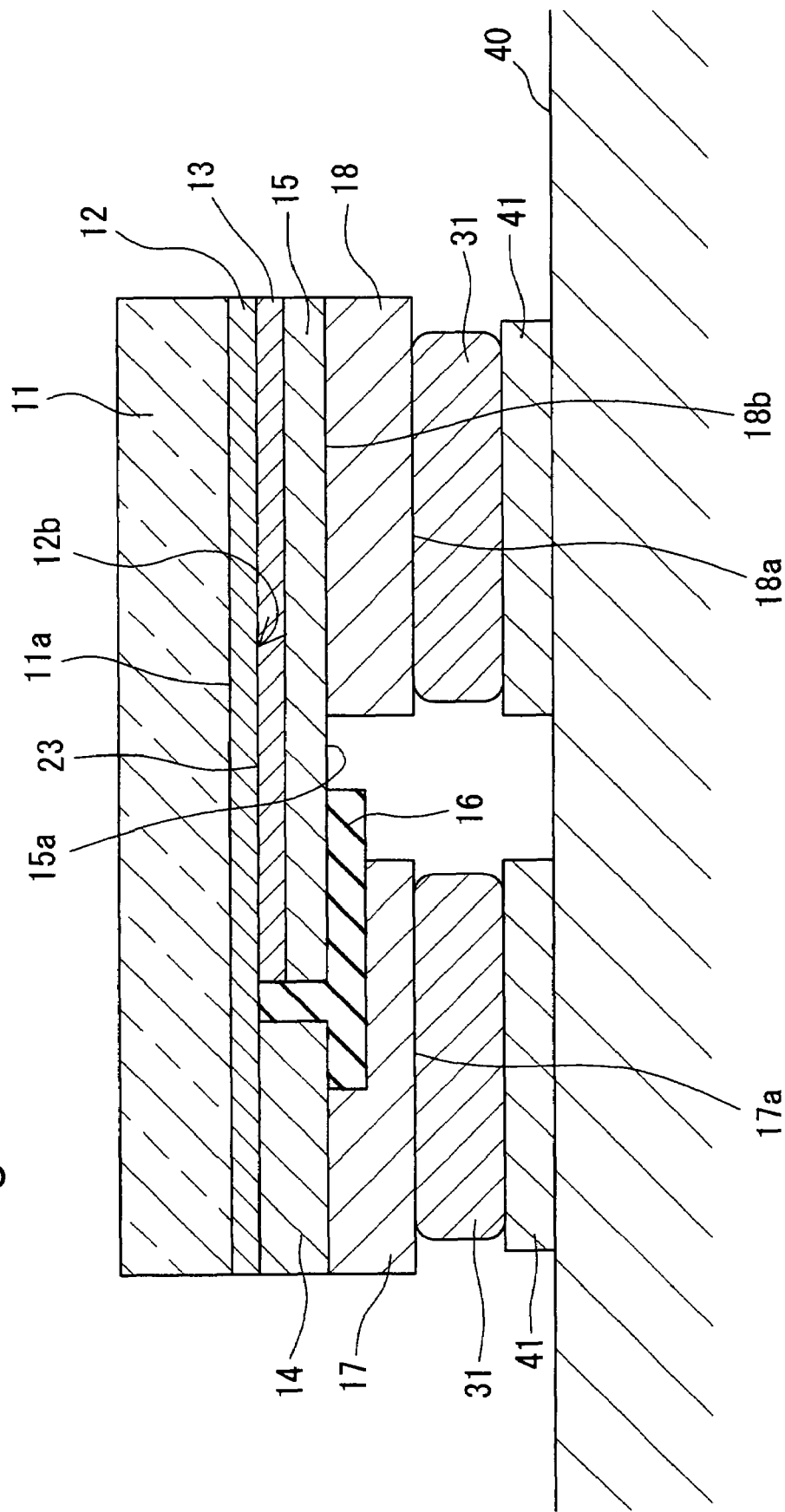
FIG. 15 is a cross-sectional view of a light-emitting device provided with an LED chip in accordance with another embodiment of the present invention.
Figure 16:
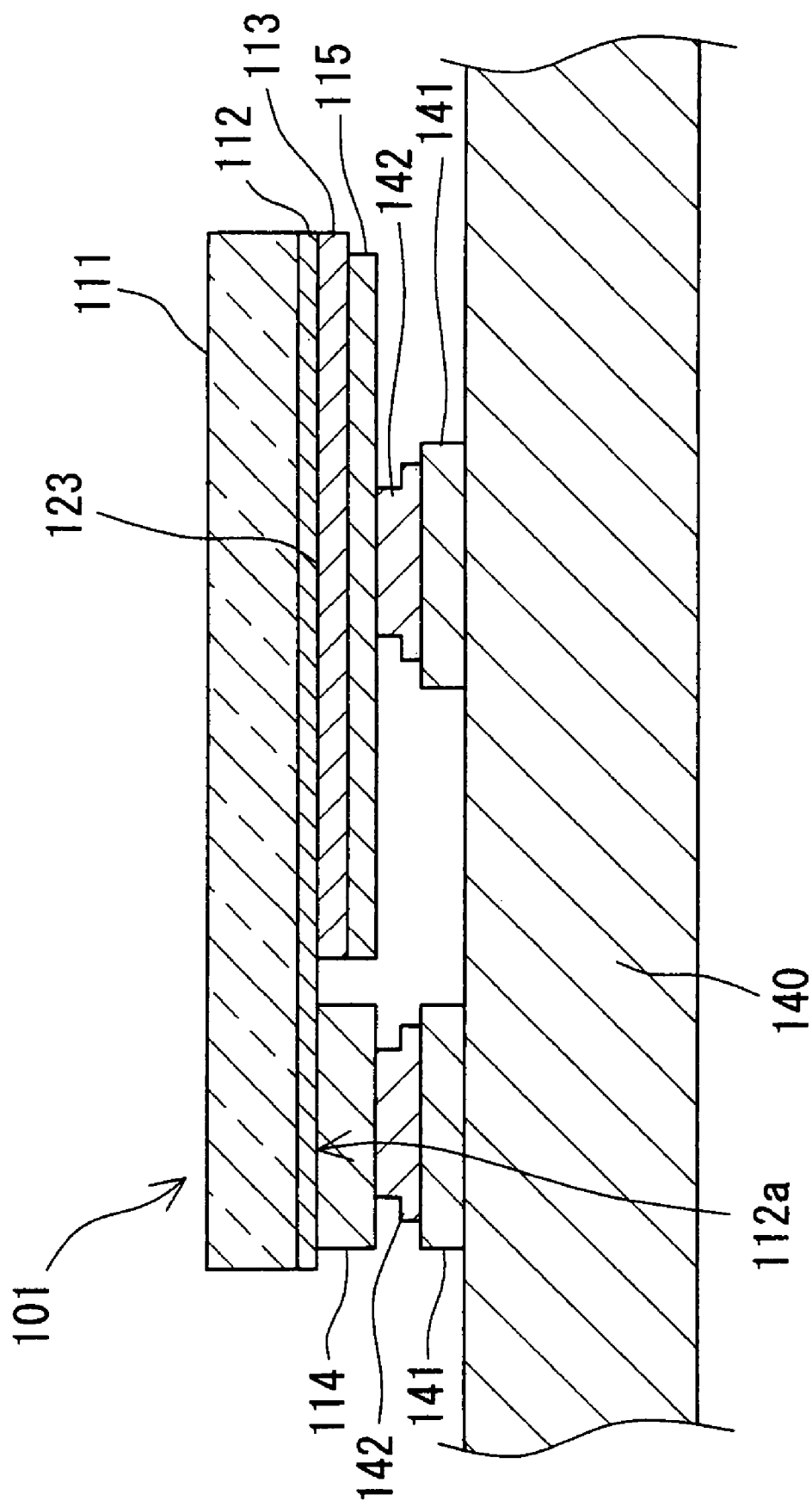
FIG. 16 is a cross-sectional view showing a light-emitting device provided with a conventional LED chip.
Figure 17:
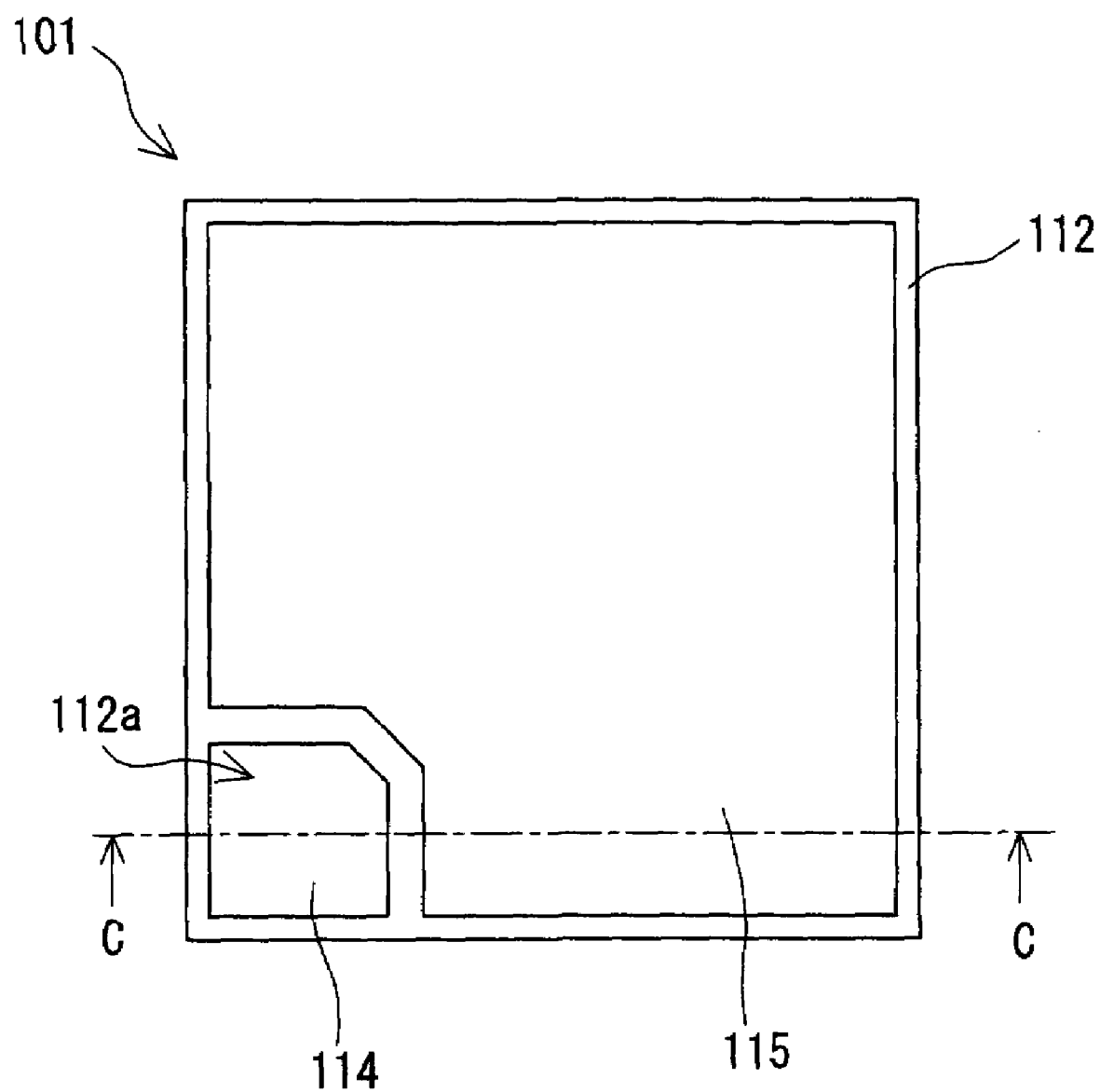
FIG. 17 is a bottom view of the conventional LED chip.

Moreover, the first insulating layer 16 is formed so as to cover the first n-electrode 14 and the first p-electrode 15, and the opening 16a for the n-electrode and the openings 16b for the p-electrode are formed so that the first n-electrode 14 and the second n-electrode 17, as well as the first p-electrode 15 and the second p-electrode 18, are electrically connected to each other; however, the present invention is not intended to be limited by this structure. For example, as shown in FIG. 15, it is only necessary for the first insulating layer 16 to be formed to insulate the first n-electrode 14, the first p-electrode 15 and the second n-electrode 17 from one another, and the upper face 18b of the second p-electrode 18 may be connected to the entire lower face 15a of the first p-electrode 15. In this case, it is not necessary to form the opening 16a for the n-electrode and the openings 16b for the p-electrode in the first insulating layer 16.

By properly combining arbitrary embodiments of the aforementioned various embodiments, the effects owned by each of them can be made effectual.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2004-279049 filed on Apr. 14, 2005 including specification, drawing and claims are incorporated herein by reference in its entirety.

INDUSTRIAL APPLICABILITY

A semiconductor light-emitting element, a manufacturing method and a mounting method of such semiconductor light-emitting element, and a light-emitting device having a circuit board on which the semiconductor light-emitting element is mounted, can be mounted on a circuit board at low costs by using a conductive bonding material, such as solder, and achieve features such as high productivity, high junction quality and high yield so that they are effectively utilized for devices, such as, in particular, a middle/large-sized liquid crystal back light, a special illuminating device and a car headlight.

The invention claimed is:

1. A semiconductor light-emitting element comprising:
a light-transmitting element substrate;
an n-type semiconductor layer formed on the element substrate so as to cover the element substrate;
a p-type semiconductor layer formed so as to cover an area on the n-type semiconductor layer from which an area for an n-electrode on the n-type semiconductor layer is excluded, for emitting light in cooperation with the n-type semiconductor layer;
a first n-electrode that is a thin film formed on the area for the n-electrode of the n-type semiconductor layer;
a first p-electrode that is a thin film formed on the p-type semiconductor layer;
a first insulating layer that is formed so as to insulate the first n-electrode and the first p-electrode from each other;
a second n-electrode formed on the first n-electrode and the first insulating layer as a thin film having an area larger than a joined face between the n-type semiconductor and the first n-electrode so that the second n-electrode is electrically connected to the first n-electrode, the second n-electrode being insulated from the first p-electrode by the first insulating layer; and
a second p-electrode formed as a thin film having an area smaller than a joined face between the n-type semiconductor layer and the p-type semiconductor layer, the second p-electrode being electrically connected to the first p-electrode.

2. A semiconductor light-emitting element comprising:
a light-transmitting element substrate;
an n-type semiconductor layer formed on the element substrate so as to cover the element substrate;
a p-type semiconductor layer formed so as to cover an area on the n-type semiconductor layer from which an area for an n-electrode on the n-type semiconductor layer is excluded, for emitting light in cooperation with the n-type semiconductor layer;
a first n-electrode that is a thin film formed on the area for the n-electrode of the n-type semiconductor layer;
a first p-electrode that is a thin film formed on the p-type semiconductor layer;
a first insulating layer having at least one opening for the n-electrode and one opening for the p-electrode formed therein, which covers the first n-electrode and the first p-electrode so as to insulate the first n-electrode and the first p-electrode from each other, except for the opening for the n-electrode and the opening for the p-electrode,
a second n-electrode formed on the first insulating layer as a thin film having an area larger than a joined face between the n-type semiconductor layer and the first n-electrode, the second n-electrode being electrically connected to the first n-electrode through the opening for the n-electrode of the first insulating layer; and
a second p-electrode formed on the first insulating layer as a thin film having an area smaller than a joined face between the n-type semiconductor layer and the p-type semiconductor layer, the second p-electrode being electrically connected to the first p-electrode through the opening for the p-electrode of the first insulating layer.

3. The semiconductor light-emitting element according to claim 2, further comprising:
a conductive layer that is formed on the first insulating layer on the p-type semiconductor layer so as to have an area that is smaller than the area of the joined face between the n-type semiconductor layer and the p-type semiconductor layer and is larger than the area on the second p-electrode, the conductive layer being electrically connected to the first p-electrode through the opening for the p-electrode of the first insulating layer; and
a second insulating layer that is formed between the conductive layer and the second n-electrode so as to insulate the conductive layer and the second n-electrode from each other,
wherein the second p-electrode is formed on the conductive layer as a thin film having an area that is larger than the joined face between the p-type semiconductor layer and the first p-electrode and the second p-electrode is electrically connected to the first p-electrode through the conductive layer.

4. The semiconductor light-emitting element according to claim 2, wherein a plurality of openings for the p-electrode of the first insulating layer are formed so as to be dispersed virtually uniformly.

5. The semiconductor light-emitting element according to claim 1, wherein the second n-electrode and the second p-electrode have virtually same size.

6. The semiconductor light-emitting element according to claim 1, wherein the conductive bonding material layer is any one of the members selected from a group consisting of solder, silver paste and anisotropic conductive resin.

7. A light-emitting device comprising:
   the semiconductor light-emitting element according to claim 1;
   a circuit board having a plurality of electrodes; and
   a conductive bonding material layer that electrically connects and fixes the second n-electrode and the second p-electrode to the electrodes on the circuit board.

8. The light-emitting element according to claim 7, wherein the conductive bonding material layer is any one of the members selected from a group consisting of solder, silver paste and anisotropic conductive resin.

9. A method for manufacturing a semiconductor light-emitting element comprising: preparing a bare light-emitting element comprising an n-type semiconductor layer formed on a light-transmitting element substrate so as to cover the element substrate; a p-type semiconductor layer formed on an area on the n-type semiconductor layer from which an area for the n-electrode on the n-type semiconductor layer is excluded, for emitting light in cooperation with the n-type semiconductor layer; a first n-electrode that is a thin film formed on the area for the n-electrode of the n-type semiconductor layer; and a first p-electrode that is a thin film formed on the p-type semiconductor layer;
   forming a first insulating layer so as to insulate the first n-electrode and the first p-electrode from each other;
   forming a second n-electrode on the first n-electrode and the first insulating layer as a thin film having an area larger than a joined face between the n-type semiconductor and the first n-electrode, so that the second n-electrode is electrically connected to the first n-electrode and is insulated from the first p-electrode by the first insulating layer; and
   forming a second p-electrode on the first p-electrode as a thin film having an area smaller than a joined face between the n-type semiconductor layer and the p-type semiconductor layer, so that the second p-electrode is electrically connected to the first p-electrode.

10. A method for manufacturing a semiconductor light-emitting element comprising:
    preparing a bare light-emitting element comprising an n-type semiconductor layer formed on a light-transmitting element substrate so as to cover the element substrate; a p-type semiconductor layer formed on an area on the n-type semiconductor layer from which the area for the n-electrode of the n-type semiconductor layer is excluded, for emitting light in cooperation with the n-type semiconductor layer; a first n-electrode that is a thin film formed on the area for the n-electrode of the n-type semiconductor layer; and a first p-electrode that is a thin film formed on the p-type semiconductor layer;
    forming a first insulating layer having at least one of each of an opening for the n-electrode and an opening for the p-electrode so as to cover the first n-electrode and the first p-electrode;
    forming, on the first insulating layer, a second n-electrode that is a thin film having an area larger than a joined face between the n-type semiconductor layer and the first n-electrode, so that the second n-electrode is electrically connected to the first n-electrode through the opening for the n-electrode of the first insulating layer; and
    forming, on the first insulating layer, a second p-electrode that is a thin film having an area smaller than a joined face between the n-type semiconductor layer and the p-type semiconductor layer, so that the second p-electrode is electrically connected to the first p-electrode through the opening for the p-electrode of the first insulating layer.

11. The method for manufacturing a semiconductor light-emitting element according to claim 10, wherein the first insulating layer is formed through sputtering.

12. The method for manufacturing a semiconductor light-emitting element according to claim 9, wherein the second n-electrode and the second p-electrode are formed through sputtering or plating.

13. A method for mounting semiconductor light-emitting elements, comprising:
    placing solder between the second n-electrode as well as the second p-electrode of the semiconductor light-emitting element according to claim 1 and a plurality of electrodes on a circuit board, and then carrying out a reflow treatment thereon, thereby the semiconductor light-emitting elements are mounted on the circuit board through solder.

\* \* \* \* \*